United States Patent
Landru

(10) Patent No.: US 8,614,501 B2
(45) Date of Patent: Dec. 24, 2013

(54) METHOD OF PRODUCING A LAYER OF CAVITIES

(75) Inventor: Didier Landru, Champ Pres Froges (FR)

(73) Assignee: SOITEC, Bernin (FR)

( * ) Notice: Subject to any disclaimer, the term of this patent is extended or adjusted under 35 U.S.C. 154(b) by 155 days.

(21) Appl. No.: 13/143,038

(22) PCT Filed: Feb. 1, 2010

(86) PCT No.: PCT/EP2010/051197
§ 371 (c)(1),
(2), (4) Date: Jun. 30, 2011

(87) PCT Pub. No.: WO2010/091972
PCT Pub. Date: Aug. 19, 2010

(65) Prior Publication Data
US 2011/0278597 A1    Nov. 17, 2011

(30) Foreign Application Priority Data

Feb. 10, 2009  (FR) ..................................... 09 50805

(51) Int. Cl.
*H01L 27/12*  (2006.01)
*H01L 21/31*  (2006.01)

(52) U.S. Cl.
USPC ............... 257/647; 257/1; 257/649; 257/506; 257/E27.112; 257/E21.24; 438/766

(58) Field of Classification Search
USPC ........ 257/1, 647, 649, 506, E27.112, E21.24; 438/766
See application file for complete search history.

(56) References Cited

U.S. PATENT DOCUMENTS

| | | | | |
|---|---|---|---|---|
| 5,374,564 A | * | 12/1994 | Bruel | 438/455 |
| 5,723,372 A | * | 3/1998 | Campisano et al. | 438/164 |
| 6,372,609 B1 | * | 4/2002 | Aga et al. | 438/459 |
| 6,495,429 B1 | * | 12/2002 | Adamcek et al. | 438/407 |
| 6,639,327 B2 | * | 10/2003 | Momoi et al. | 257/131 |
| 6,770,507 B2 | * | 8/2004 | Abe et al. | 438/64 |
| 6,808,967 B1 | | 10/2004 | Aspar et al. | |

(Continued)

FOREIGN PATENT DOCUMENTS

| EP | 1870930 A | 12/2007 |
|---|---|---|
| JP | 56110247 A | 9/1981 |

(Continued)

OTHER PUBLICATIONS

International Search Report for International Application No. PCT/EP2010/051197 mailed Apr. 1, 2010, 3 pages.

(Continued)

*Primary Examiner* — Victor A Mandala
(74) *Attorney, Agent, or Firm* — TraskBritt

(57) ABSTRACT

A method of producing a layer of cavities in a structure comprises at least one substrate formed from a material that can be oxidized or nitrided, the method comprising the following steps: implanting ions into the substrate in order to form an implanted ion concentration zone at a predetermined mean depth; heat treating the implanted substrate to form a layer of cavities at the implanted ion concentration zone; and forming an insulating layer in the substrate by thermochemical treatment from one surface of the substrate, the insulating layer that is formed extending at least partially into the layer of cavities.

20 Claims, 3 Drawing Sheets

(56) References Cited

U.S. PATENT DOCUMENTS

| | | | |
|---|---|---|---|
| 8,101,503 B2 | 1/2012 | Aspar et al. | |
| 2006/0118918 A1* | 6/2006 | Waite et al. | 257/627 |
| 2007/0190746 A1* | 8/2007 | Ito et al. | 438/455 |
| 2010/0289115 A1* | 11/2010 | Akiyama et al. | 257/507 |

FOREIGN PATENT DOCUMENTS

| | | |
|---|---|---|
| JP | 10050628 A | 2/1998 |
| WO | 2005034218 A2 | 4/2005 |
| WO | 2007110515 A2 | 10/2007 |

OTHER PUBLICATIONS

Assaf et al., Structural and Nuclear Characterizations of Defects Created by Noble Gas Implantation in Silicon Oxide, Nuclear Instruments and Methods, B 253 (2006), 222 226.

International Preliminary Report on Patentability and Written Opinion for International Application No. PCT/EP2010/051197 dated Aug. 16, 2011, 6 pages.

* cited by examiner

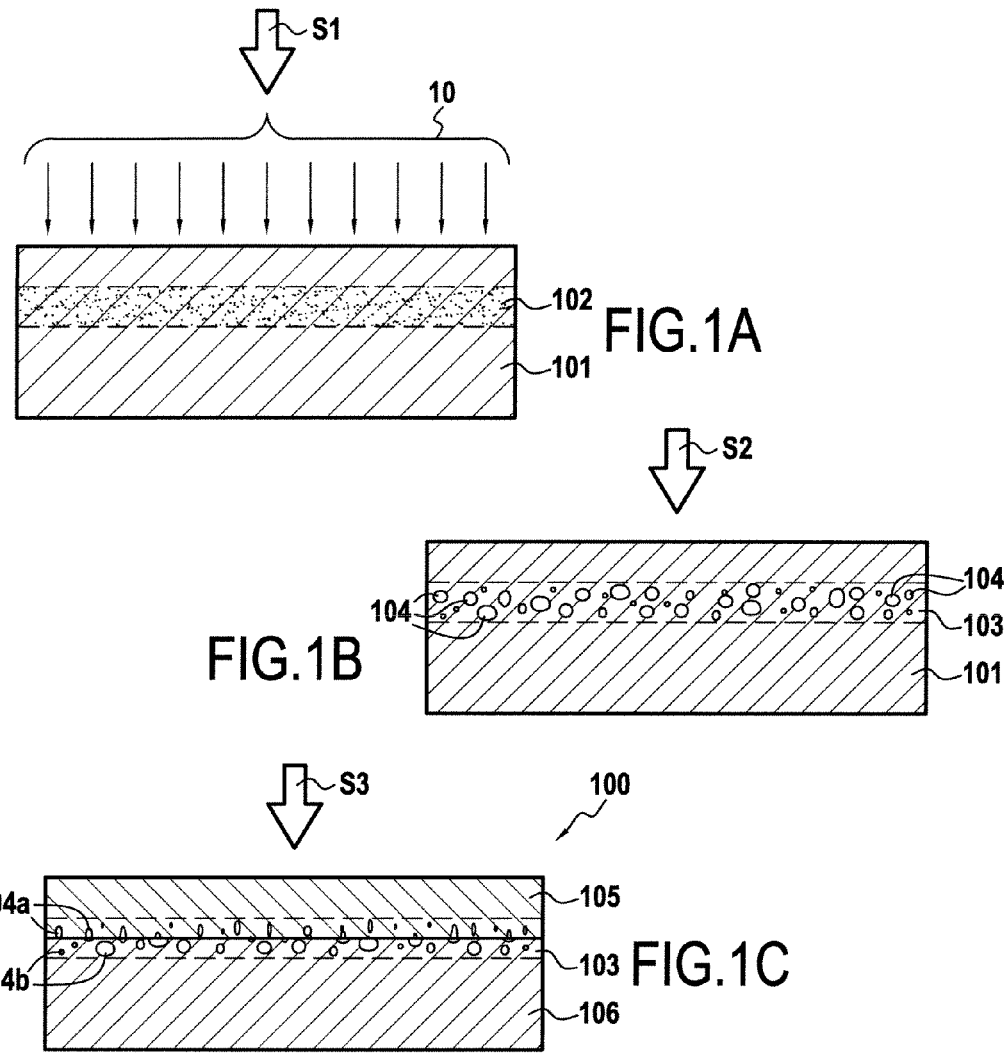
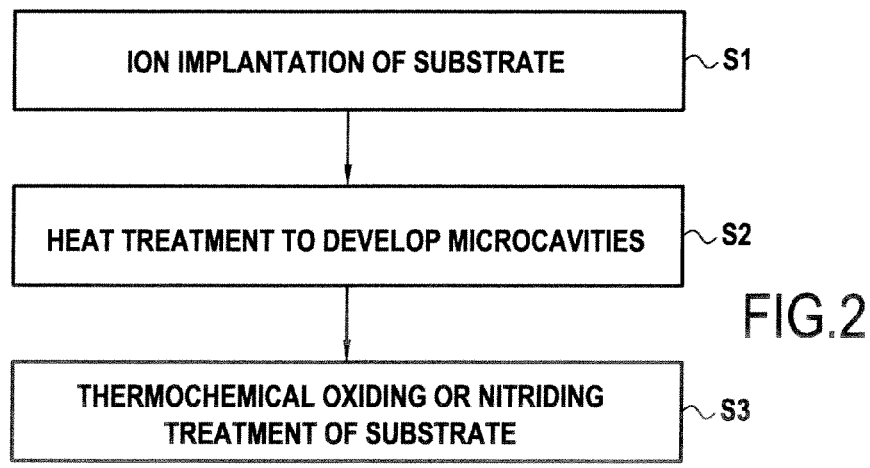

METHOD OF PRODUCING A LAYER OF CAVITIES

CROSS-REFERENCE TO RELATED APPLICATIONS

This is a national phase entry under 35 U.S.C. §371 of International Patent Application PCT/EP2010/051197, filed Feb. 1, 2010, published in English as International Patent Publication WO 2010/091972 A1 on Aug. 19, 2010, which claims the benefit under Article 8 of the Patent Cooperation Treaty of French Patent Application Serial No. 0950805, filed Feb. 10, 2009, the entire disclosure of each of which is hereby incorporated herein by this reference.

TECHNICAL FIELD

The present invention relates to a method of producing cavities disposed in an insulating layer of oxide or nitride.

BACKGROUND

During the fabrication of multilayer structures such as SeOI (semiconductor-on-insulator) type structures for electronic, microelectronic, and optoelectronic applications, it is routine to interpose insulating layers between wafers of semiconductor materials such as silicon wafers, for example.

Further, it may be necessary to form microcavities or microbubbles in the insulating structure. This applies, in particular, when the structure is to be capable of being taken apart at the insulating layer, as described in International Patent Publication WO 2005/034218A.

The document "Structural and Nuclear Characterizations of Defects Created by Noble Gas Implantation in Silicon Oxide" by H. Assaf et al., *Nuclear Instruments and Methods*, B 253 (2006), 222-26, for example, describes a method of forming microbubbles in a layer of silicon oxide ($SiO_2$) in order to reduce the value of the dielectric constant k of the oxide layer and, as a result, its permittivity. The method described in that document consists of implanting a layer of $SiO_2$ formed on a silicon substrate with heavy rare gas ions such as xenon. Implantation allows microbubbles to be formed in the $SiO_2$ layer.

However, that method requires the use of heavy rare gas ions, which involves the use of particular ion sources and of more expensive equipment (implanter). Implantation with heavy ions requires higher implantation energy and generates more damage in the implanted material compared with implantation carried out with hydrogen or helium ions, for example. Further, with such ions, it is difficult to control the implantation depth of the ions in the oxide layer and, as a result, the zone over which the microbubbles extend.

There now exists a need to be able to form insulating layers comprising cavities in substrates in a manner that is accurate and economical.

BRIEF SUMMARY OF THE INVENTION

The aim of the present invention is to propose a solution that enables cavities to be produced in an insulating layer without the above-mentioned disadvantages.

To this end, the invention proposes a method of producing a layer of cavities in a structure comprising at least one substrate formed from a material that can be oxidized or nitrided, the method comprising the following steps:

implanting ions into the substrate in order to form an implanted ion concentration zone at a predetermined mean depth;

heat treating the implanted substrate to form a layer of cavities at the implanted ion concentration zone; and forming an insulating layer in the substrate by thermochemical treatment from one surface of the substrate, the insulating layer that is formed extending at least partially into the layer of cavities.

Thus, by producing a layer of cavities before forming the insulating layer, it is possible to accurately control the formation of the layer of cavities since implantation is carried out into a homogeneous substrate without having to use special ions such as heavy rare gas ions for implantation. Further, the (total or partial) degree by which the layer of cavities overlaps the insulating layer may also be accurately controlled since all that is required is to stop the insulating layer formation front at the desired region in the substrate.

In one aspect of the invention, the insulating layer formed by thermochemical treatment extends over the entire layer of cavities.

In one implementation of the invention, the thermochemical treatment of the surface substrate is carried out in an oxidizing atmosphere in order to form an insulating layer of oxide.

In another implementation of the invention, the thermochemical treatment of the substrate surface is carried out in a nitriding atmosphere in order to form an insulating layer of nitride.

In a particular aspect of the invention, one or more dopants are introduced into the substrate during thermochemical treatment. These dopants may in particular introduce positive or negative charges into the cavities of the insulating layer.

The invention also proposes a method of producing a multilayer structure, comprising at least bonding a first structure onto a second structure, the second structure comprising a substrate including a layer of cavities and an insulating layer formed in accordance with the method of the invention for forming a layer of cavities.

The first structure may in particular comprise a layer of semiconductor material such as a layer of silicon. Thus, a multilayer SeOI-type structure is formed with a buried insulating layer including cavities.

The invention also provides a composite structure comprising a substrate constituted by a material that is capable of being oxidized or nitrided, the structure further comprising an insulating layer formed by thermochemical treatment of the material of the substrate, the insulating layer including a layer of cavities, the structure being characterized in that the cavities of the layer are oblong in shape and in that cavities are oriented in the same direction.

The insulating layer may be a layer of oxide or nitride.

In one aspect of the invention, the cavities of the layer of cavities contain one or more dopants selected from at least: nitrogen, boron, arsenic, phosphorus, antimony, aluminum, gallium, iron, nickel, and cobalt.

BRIEF DESCRIPTION OF THE DRAWINGS

The characteristics and advantages of the present invention become apparent from the following description made, by way of non-limiting indication, with reference to the accompanying drawings in which:

FIGS. 1A through 1C are diagrammatic sectional views showing the formation, in a silicon substrate, of a layer of cavities and of an insulating layer in accordance with one implementation of the invention;

FIG. 2 is a flowchart of the steps carried out in FIGS. 1A through 1C;

DETAILED DESCRIPTION OF THE INVENTION

Figure 3:
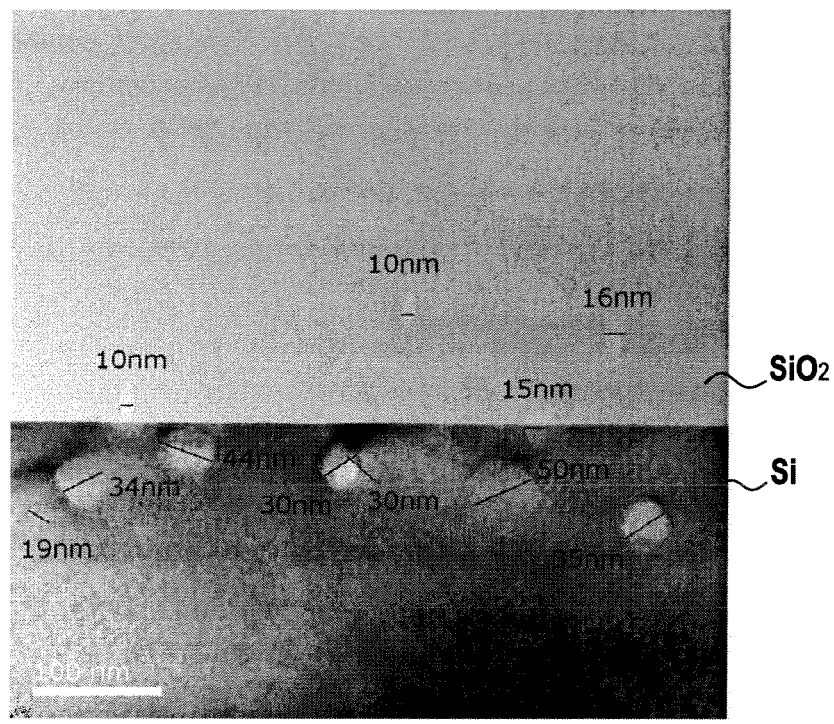
FIGS. 3 through 5 are microphotographs taken with a transmission electron microscope and showing a layer of microcavities formed in a silicon substrate, which substrate is then being oxidized in accordance with one implementation of the method of a invention.

The present invention is of general application to any material that can be implanted with ionic species and that is capable of being oxidized and/or nitrided. By way of non-limiting example, the following materials may be used to carry out the method of the invention:

oxidizable and/or nitridable metals and metal alloys (iron, zinc, copper, steel, titanium, zirconium, etc.);

crystalline semiconductor materials such as silicon, III/V materials (GaAs, GaN, etc.), germanium and its compounds such as SiGe; and silicon carbide (SiC).

One implementation of the method of the invention is described below with reference to FIGS. 1A through 1C and 2, applied to formatting a layer of cavities in an oxide layer of a silicon substrate.

In particular, a method of the invention comprises the steps of ion implantation, heat treatment to develop the cavities, and thermochemical treatment to form a layer of oxide or nitride. The ion implantation of a substrate, for example, using hydrogen ($H^+$) and/or helium (He) ions, is carried out with an implantation dose in the range of $1\times10^{15}$ to $1\times10^{19}$ atoms/cm$^2$ (atoms/square centimeter) and with an implantation energy in the range of 10 keV (kiloelectron volts) to 200 keV. The heat treatment to develop the cavities in the implanted substrate is generally carried out in the range of 700° C. to 1300° C., preferably in the range of 900° C. to 1200° C., for a period in the range of 10 minutes to 20 hours, preferably in the range of 1 hour to 10 hours. The oxidation/nitriding thermochemical treatment is generally carried out in the range of 700° C. to 1300° C. for oxidation and in the range of 900° C. to 1300° C. for nitriding, the treatment period generally being several hours.

As illustrated in FIG. 1A, the method commences by implanting a silicon substrate 101 in the form of a wafer having, for example, a thickness of 0.7 mm (millimeter) and a diameter in the range of 50 mm to 300 mm (step S1). During implantation, the silicon substrate 101 undergoes bombardment with ions 10, for example, He ions. The ions 10 penetrate into the substrate 101 and are brought to a halt at a predetermined depth therein, creating an implanted ion concentration zone 102 at a predetermined mean depth in the substrate 101. The term "mean depth" is used for the concentration zone 102 because the implanted ions 10 lose their energy via a succession of impacts with the atoms of the crystal lattice of the silicon and they do not all stop at exactly the same depth. In other words, the implanted ion concentration zone 102 extends over a certain thickness in the substrate 101.

As is well-known, a mean depth of an implanted ion concentration zone in a substrate is determined by the implantation energy, naturally taking into account the nature of the ions used and the implanted material. The degree of concentration of the ions in the ion concentration zone is determined by the implantation dose employed. In the example described here, implantation is carried out with He ions and with an implantation energy of 75 keV and an implantation dose of approximately $8\times10^{16}$ atoms/cm$^2$. With these implantation conditions, an implanted ion concentration zone 102 is formed at a mean depth from the surface of the substrate 101 of a few hundred nanometers, the ion concentration zone 102 extending over a thickness of approximately one hundred nanometers.

Once the silicon substrate 101 has been implanted, heat treatment or annealing is carried out in order to use the defects created by the ions 10 in the implanted ion concentration zone 102 to form a layer 103 comprising microcavities or microbubbles 104 (FIG. 1B, step S2). In the example described here, the heat treatment is carried out at a temperature of 950° C. for a period of approximately 8 hours. The layer 103 has a thickness in the range of 190 nm (nanometer) to 220 nm. For substrates formed from different materials and/or for different implantation species, the temperature and period for the heat treatment to develop microcavities should be adjusted.

The method is then continued by forming a layer 105 of silicon oxide (SiO$_2$) (FIG. 1C, step S3). More precisely, the substrate 101 is oxidized from one of its surfaces, here the implanted surface of the substrate 101. To this end, the substrate 101 undergoes a thermochemical treatment that consists in placing the substrate 101 in a chamber maintained at a predetermined temperature and in which the surface of the substrate 101 is exposed to an oxidizing atmosphere. By way of non-limiting example, the oxidizing atmosphere may be constituted from gaseous oxygen (O$_2$), optionally with hydrogen, and/or hydrogen chloride (HCl), and/or argon (Ar). The oxidizing atmosphere may also be composed of water vapor (H$_2$O), optionally with hydrogen, and/or hydrogen chloride (HCl), and/or argon (Ar).

The duration of the thermochemical treatment depends on the thickness of the SiO$_2$ layer 105 that is to be obtained, as well as on the rate of advance of the oxidation front into the silicon substrate 101. The duration of the thermochemical oxidation treatment may be adjusted in order to stop the oxidation front within the layer 103. Under such circumstances, microcavities 104a, 104b exist both in the oxide layer formed and in a subjacent portion of the silicon substrate 101. However, the duration may be prolonged in order to stop the oxidation front beyond the layer 103 such that all microcavities 104a, 104b are included in the oxide layer.

In the example described herein, the formed oxide layer at least partially overlaps the layer 103, in order to have at least a fraction of the microcavities 104a, 104b included in the SiO$_2$ layer 105. To this end, the silicon substrate 101 is treated in an atmosphere principally containing gaseous oxygen at a temperature of 950° C. for a period of 3 hours. These treatment conditions mean that a SiO$_2$ layer 105 with a thickness e of 690 nm (nanometers) is formed. The techniques and conditions for carrying out the thermochemical oxidation treatment are well-known to the skilled person and are not described in further detail, for the purposes of simplification.

As can be seen in FIG. 1C, a structure 100 is obtained comprising a SiO$_2$ layer 105 on a layer of silicon 106 corresponding to the portion of silicon substrate 101 (FIG. 1B) that has not been oxidized, the structure 100 further comprising a buried microcavity layer 103 that is present in both the SiO$_2$ layer 105 and in the silicon layer 106.

Hence, in accordance with the invention, cavities are transferred from a material that is capable of being oxidized or nitrided to an oxide layer or a nitride layer, respectively. In particular, surprisingly, the cavities are conserved during the thermochemical oxidation or nitriding treatment. Oxidizing the portion of silicon substrate 101 including the microcavities 104 (FIG. 1B) does not cause them to disappear, which means that an insulating layer can be formed, such as an oxide layer, which layer includes microcavities that have already been formed in the silicon substrate. However, the microcavities 104a present in the SiO$_2$ layer 105 may change in volume and shape compared with the microcavities 104b (FIG. 1C) still present in the non-oxidized silicon substrate portion. During oxidation, the microcavities affected by the oxidation front tend to be oxidized or nitrided to a greater or lesser extent as a function of the crystalline axes, but with the cavities, still being present after the treatment.

Measurements of the shape, size, and density of the microcavities have been carried out on a silicon substrate that had undergone implantation, a heat treatment to develop microcavities, and an oxidation under the same operating conditions as those described above.

Figure 4:
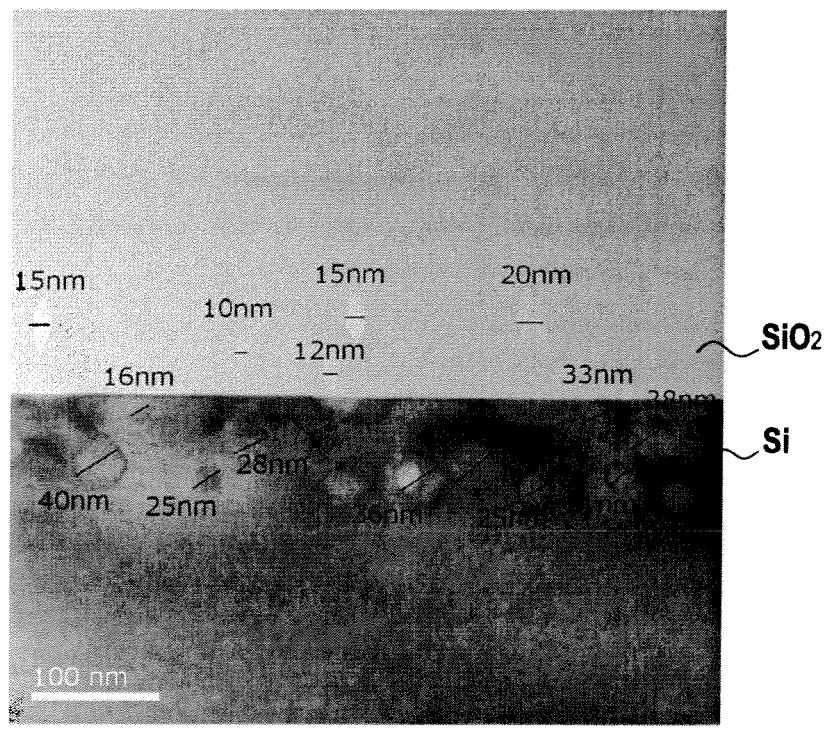
Figure 5:
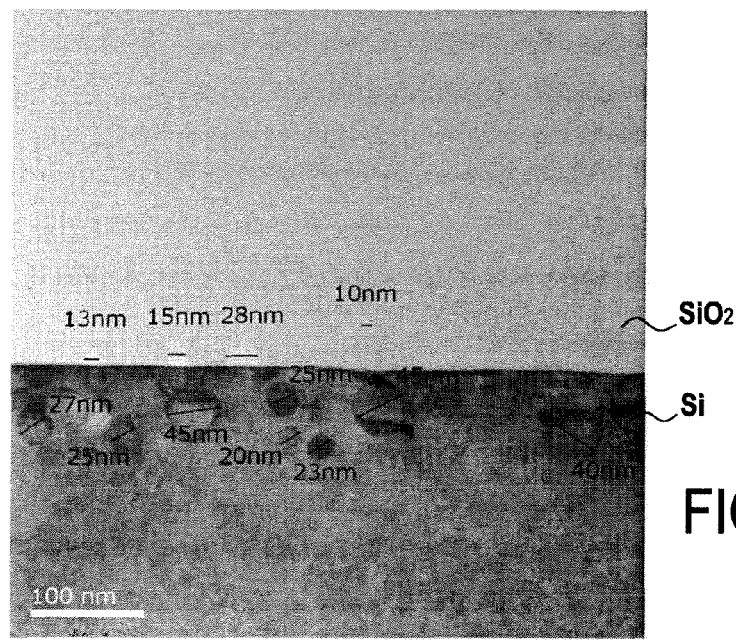

The mean thickness of the layer of microcavities was approximately 200 nm. As can be seen in FIGS. 3 through 5, the microcavities present in the oxide layer are oblong or ellipsoidal in shape, i.e., they have an elongate shape principally characterized by a length and a width. These cavities have a width mainly in the range of 1 nm to 30 nm and a length mainly in the range of 10 nm to 60 nm. The mean density of the microcavities in the oxide layer is $1.2 \times 10^{15}$ cavities.cm$^{-3}$.

The microcavities present in the silicon layer (non-oxidized substrate portion) have a truncated polyhedral shape and a diameter that is principally in the range of 25 nm to 35 nm (FIGS. 3 through 5). The mean density of the microcavities in the silicon layer is $3.7 \times 10^{15}$ cavities.cm$^{-3}$.

The overall mean density of the microcavities in the two layers (oxide and silicon layers) is $2.5 \times 10^{15}$ cavities.cm$^{-3}$.

Figure 6:
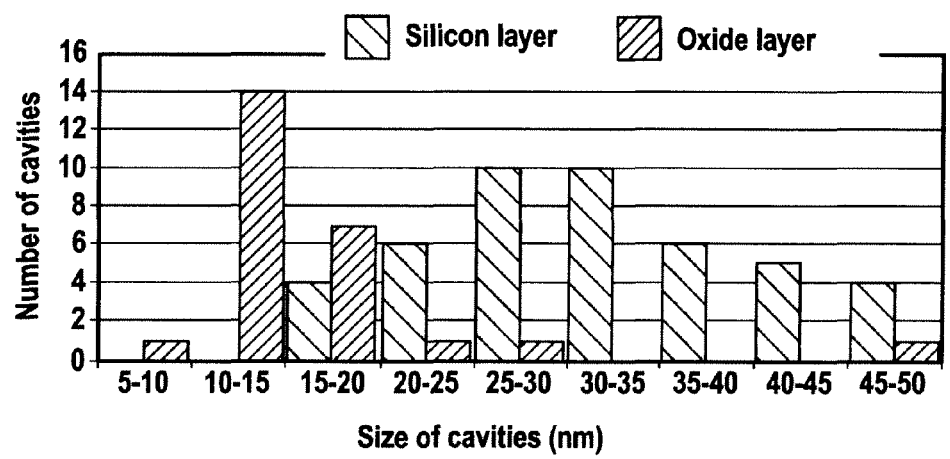
FIG. 6 is a graph showing the size and the distribution of microcavities formed in an oxidized silicon substrate in accordance with one implementation of the method of the invention.

FIG. 6 illustrates the size distribution of the microcavities in the oxide layer and in the silicon layer. As can be seen in FIG. 6, the diameter of the cavities present in the silicon layer is distributed in accordance with a Gaussian distribution.

Ion implantation may be carried out with different species. In particular, it may be carried out with hydrogen and/or helium ions. Implantation of helium has the particular advantage of it being possible to implant a large dose of ions without the risk of fracturing the substrate.

In another implantation of the invention, the oxide layer including all or some of the microcavities may be replaced by a layer of nitride.

Under such circumstances, in order to form a layer of nitride with microcavities, the above-described steps of implantation and heat treatment to develop microcavities are carried out on a substrate that is capable of being implanted and nitrided. In order to form a layer of nitride instead of a layer of oxide, during the thermochemical treatment, the oxidizing atmosphere used in the above-described thermochemical treatment needs to be replaced by a nitriding atmosphere. Particular non-limiting examples of a nitriding atmosphere are those comprising nitrogen, ammonia (NH$_3$), silane (SiH$_4$), etc. In a similar manner to the thermochemical oxidation treatment, the nitriding front is stopped at a desired depth in the substrate, i.e., within the layer of microcavities, if microcavities are desired both in the nitrided layer and in the non-nitrided portion of substrate, or beyond the layer of microcavities, if all of the microcavities are to be included in the nitrided layer.

With an initial substrate of silicon, for example, after implantation and heat treatment to develop the microcavities of the substrate, it is possible to form a layer of silicon nitride (Si$_3$N$_4$) including all or some of the microcavities by exposing the substrate to a nitrogen atmosphere maintained at a temperature in the range of 900° C. to 1300° C.

The structure obtained in accordance with the method of the invention, i.e., a substrate comprising a layer of microcavities and a layer of oxide or nitride extending at least partially into the layer of microcavities, may be used for a variety of applications.

In particular, with an initial substrate formed from a semiconductor material (silicon, germanium, etc.), the structure may be bonded onto a second substrate in order to form an SeOI (semiconductor-on-insulator) type structure. The buried insulating layer then includes cavities.

By bonding the structure 100 (FIG. 1C) of the invention onto another substrate, it is possible to form a releasable structure. The layer of oxide or nitride including the microcavities forms a weakened interface that may be ruptured under the action, for example, of a mechanical detaching force, for example, by introducing a blade into the microcavities and using it to exert a force to separate the substrates. The risks of unwanted fracture during the heat treatments are very low since microcavities do not develop, or develop only to a slight extent, in an oxide or a nitride. In this application, the microcavities are preferably entirely contained in the layer of oxide or of nitride.

Hence, a releasable substrate is provided that is highly tolerant to high temperatures and, as a result, to the fabrication of electronic components, for example, of the complementary-metal oxide semiconductor (CMOS) type requiring temperatures of the order on 900° C. The substrate may then be fractured mechanically or chemically, at any time. Any residues of a releasable layer of oxide, for example, may then be removed by applying a solution of hydrofluoric acid (HF).

The present invention may also be used to produce structures including low-density insulating layers (oxide or nitride) having a low dielectric constant, or even a functionalization as indicated above. The microcavities contribute to reducing the mean density of the insulating layer and they enclose an atmosphere having a low electric value. This thereby reduces the coupling between the wafers, limiting the permittivity of the insulating layer.

Further, the microcavities may be functionalized, in particular by doping. Thus, by introducing nitrogen during the thermochemical oxidation treatment, for example, the nitrogen is caused to migrate to the interfaces of the cavities and create negative charges therein.

In general, it is possible to introduce different species into the cavities, in particular metals, by doping during the thermochemical oxidation or nitriding treatment. By introducing conductive materials into the cavities, it is possible to produce buried layers of oxide or nitride that are electrically charged. It is also possible to form layers comprising isolated electrodes, for example, floating gates, by functionalizing the cavities by introducing species forming conductive or semiconductive materials.

Doping and/or functionalizing the cavities may, in particular, be carried out after oxidation/nitriding ("post-ox," "post-nitride") or during oxidation/nitriding per se, using one of the following techniques:

implantation;

annealing after oxidation/nitriding, in an atmosphere comprising specific gases or precursors that, for example, allow diffusion of active species; and plasma.

The species used during doping and/or functionalization may be selected from at least one of the following species:

nitrogen (charges on the surface of the cavities);

dopants such as boron, arsenic, phosphorus, antimony, aluminum, gallium, etc., in particular, in order to modify the band diagram of a semiconductor; and metals such as iron, nickel, cobalt, etc., which modify the electrical properties by migrating toward the surface of the cavities.

Any other material that can functionalize the cavities may be envisaged.

The cavities present in the oxide or nitride layer may also act as traps for contaminating species that may cause electrical disturbances. By trapping this type of species in the cavities in the buried layer of oxide or nitride, i.e., far from the interfaces with the useful layers present above the oxide or nitride catalytic, the quality and the electrical properties of the useful layers are improved.

The cavities in the layer of oxide or nitride may also act as traps for hydrogen atoms. Under such circumstance, the cavities greatly increase the hydrogen storage capacity of the layer of oxide or nitride, in particular, when it is thin. The solubility of hydrogen in an oxide or a nitride is very low and the presence of cavities means that the capacity to retain hydrogen trapped thereby is increased. During bonding of a substrate to the structure 100 (FIG. 1C) of the invention, trapping and conservation of hydrogen in the layer of oxide or nitride including microcavities means that it is possible to avoid re-opening the bonding interface between these two elements during heat treatments, in particular, during heat treatments for consolidation of the bonding interface. Cavities are also formed at the bonding interface and may be placed under pressure using hydrogen that diffuses from the structure 100. By retaining the hydrogen at the layer of oxide or nitride, it cannot reach the cavities present at the bonding interface, which, thus, ensures good bonding integrity.

Figure 7:
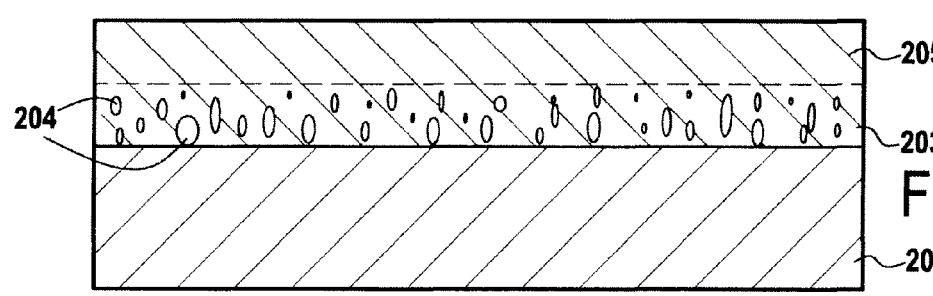
FIG. 7 is a diagrammatic view of a composite structure in accordance with one implementation of the invention.

FIG. 7 illustrates a composite structure 200 produced in accordance with the method of the invention. The composite structure 200 is a silicon substrate including an insulating SiO$_2$ layer 205 formed by surface oxidation of the substrate. The composite structure 200 also includes a layer of silicon 206 corresponding to the non-oxidized portion of the silicon substrate. The composite structure 200 also includes a buried layer of microcavities 203 that is present in its entirety in the insulating SiO$_2$ layer 205. In accordance with the invention, this buried layer of microcavities 203 is formed by ion implantation and heat treatment of the substrate before the formation of the insulating layer under conditions similar to those described above. As explained above, the formation of the insulating SiO$_2$ layer 205 does not cause the disappearance of cavities already formed in the substrate but modifies their shape. In fact, after the oxidation (or nitriding) front has passed into the buried layer of microcavities 203, the cavities all have a substantially oblong shape that is principally due to anisotropy of the rate of growth of the insulating layer during the oxidation/nitriding step.

Further, after the insulating layer has been formed in the buried layer of microcavities 203, the cavities with an oblong shape are all oriented in the same direction as regards their length. In FIG. 7, the microcavities 204 are all oriented with their lengths vertical. However, it is possible to obtain cavities with an oblong shape oriented in other directions, such as cavities that are parallel to the plane of the substrate or forming an angle therewith. The orientation of the cavities principally depends on the crystalline orientation presented by the substrate prior to the oxidation/nitriding step.

Obtaining a layer of cavities of oblong shape that are aligned with one another in an insulating layer has particular advantages. When the composite structure 200 (FIG. 7) of the invention is used to form a structure that is releasable by mechanical fracture at the insulating layer including the cavities, the alignment of the cavities means that the process of fracture can be better controlled and a continuous and regular fracture line can be formed, meaning that the post-fracture roughness is thereby reduced. When the cavities are functionalized, for example by introducing electrical charges by doping the cavities, the alignment of the cavities means that the overall electrical properties of the layer can be adjusted.

The invention claimed is:

1. A method of producing a layer of cavities in a structure comprising at least one substrate formed from a material that can be oxidized or nitrided, the method comprising:
    implanting ions into the at least one substrate in order to form an implanted ion concentration zone at a predetermined mean depth;
    heat treating the at least one substrate having the implanted ions therein to form a layer of cavities at the implanted ion concentration zone; and
    after heat treating the at least one substrate having the implanted ions therein, forming an insulating layer in the at least one substrate by thermochemical treatment from at least one surface of the at least one substrate, the insulating layer extending at least partially into the layer of cavities, the cavities of the layer of cavities within the insulating layer having an elongated shape.

2. The method of claim 1, wherein the insulating layer formed by thermochemical treatment extends entirely over the layer of cavities.

3. The method of claim 1, wherein the material of the at least one substrate comprises at least one of silicon, a III/V material, germanium, silicon germanium, and silicon carbide.

4. The method of claim 3, wherein the thermochemical treatment of the at least one substrate is carried out in an oxidizing atmosphere to form the insulating layer to comprise an oxide.

5. The method of claim 3, wherein the thermochemical treatment of the at least one substrate is carried out in a nitriding atmosphere to form the insulating layer to comprise a nitride.

6. The method of claim 1, wherein the thermochemical treatment of the at least one substrate is carried out in an oxidizing atmosphere to form the insulating layer to comprise an oxide.

7. The method of claim 1, wherein the thermochemical treatment of the at least one substrate is carried out in a nitriding atmosphere to form the insulating layer to comprise a nitride.

8. The method of claim 1, further comprising introducing one or more dopants into the at least one substrate during the thermochemical treatment.

9. The method of claim 8, further comprising selecting the one or more dopants to comprise at least one of nitrogen, boron, arsenic, phosphorus, antimony, aluminum, gallium, iron, nickel, and cobalt.

10. A method of producing a layer of cavities in a structure comprising at least one substrate formed from a material that can be oxidized or nitrided, the method comprising:
    implanting ions into the at least one substrate in order to form an implanted ion concentration zone at a predetermined mean depth;
    heat treating the at least one substrate having the implanted ions therein to form a layer of cavities at the implanted ion concentration zone; and
    after heat treating the at least one substrate having the implanted ions therein, forming an insulating layer in the at least one substrate by thermochemical treatment from at least one surface of the at least one substrate, the thermochemical treatment of the at least one substrate being carried out in an oxidizing atmosphere to form the insulating layer to comprise an oxide, the insulating layer extending at least partially into the layer of cavities, wherein the insulating layer extends into an upper portion of the layer of cavities, a lower portion of the layer of cavities being located in a non-oxidized region of the at least one substrate, and wherein cavities present in the insulating layer are substantially oblong in shape and have a width in a range extending from about 1 nm to about 30 nm and a length in a range extending from about 10 nm to about 60 nm and cavities in the non-oxidized region of the at least one substrate have a diameter in a range extending from about 25 nm to about 35 nm.

11. A method of producing a multilayer structure, comprising:
   forming a first structure, comprising:
      implanting ions into at least one substrate in order to form an implanted ion concentration zone at a predetermined mean depth;
      heat treating the at least one substrate having the implanted ions therein to form a layer of cavities at the implanted ion concentration zone; and
      after heat treating the at least one substrate having the implanted ions therein, forming an insulating layer in the at least one substrate by thermochemical treatment from at least one surface of the at least one substrate, the insulating layer extending at least partially into the layer of cavities, the cavities of the layer of cavities within the insulating layer having an elongated shape; and
   bonding at least a second structure onto the first structure.

12. The method of claim 11, further comprising selecting the at least a second structure to comprise a layer of semiconductor material, and wherein the multilayer structure comprises an SeOI type structure.

13. A composite structure comprising:
   a substrate comprising a material capable of being oxidized or nitrided;
   an insulating layer in the substrate; and
   a layer of cavities at least partially within the insulating layer, the cavities of the layer of cavities being oblong in shape and oriented in a common direction.

14. The composite structure of claim 13, wherein the material of the substrate comprises at least one of silicon, a III/V material, germanium, silicon germanium, and silicon carbide.

15. The composite structure of claim 14, wherein the insulating layer comprises an oxide or a nitride.

16. The composite structure of claim 14, wherein the cavities of the layer of cavities contain one or more dopants selected from the group consisting of nitrogen, boron, arsenic, phosphorus, antimony, aluminum, gallium, iron, nickel, and cobalt.

17. The composite structure of claim 16, wherein the cavities of the layer of cavities have a width in a range extending from about 1 nm to about 30 nm and a length in a range extending from about 10 nm to about 60 nm.

18. The composite structure of claim 13, wherein the insulating layer comprises an oxide or a nitride.

19. The composite structure of claim 13, wherein the cavities of the layer of cavities contain one or more dopants selected from the group consisting of nitrogen, boron, arsenic, phosphorus, antimony, aluminum, gallium, iron, nickel, and cobalt.

20. A composite structure comprising:
   a substrate comprising a material capable of being oxidized or nitrided;
   an insulating layer in the substrate; and
   a layer of cavities at least partially within the insulating layer, the cavities of the layer of cavities being oblong in shape, oriented in a common direction, and having a width in a range extending from about 1 nm to about 30 nm and a length in a range extending from about 10 nm to about 60 nm.

* * * * *